(12) United States Patent
Kim

(10) Patent No.: US 11,347,347 B2
(45) Date of Patent: May 31, 2022

(54) TOUCHSCREEN DISPLAY DEVICE

(71) Applicant: LG Display Co., Ltd., Seoul (KR)

(72) Inventor: SeokSu Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 133 days.

(21) Appl. No.: 16/709,410

(22) Filed: Dec. 10, 2019

(65) Prior Publication Data

US 2020/0201508 A1 Jun. 25, 2020

(30) Foreign Application Priority Data

Dec. 24, 2018 (KR) .................. 10-2018-0168275

(51) Int. Cl.
 *G06F 3/041* (2006.01)
 *H01L 27/32* (2006.01)
 *H01L 27/12* (2006.01)

(52) U.S. Cl.
 CPC ...... *G06F 3/04164* (2019.05); *H01L 27/1255* (2013.01); *H01L 27/323* (2013.01); *H01L 27/3276* (2013.01)

(58) Field of Classification Search
 CPC ............. G06F 3/04164; H01L 27/3276; H01L 27/1255; H01L 27/323
 See application file for complete search history.

(56) References Cited

U.S. PATENT DOCUMENTS

| 2015/0077375 A1 | 3/2015 | Hotelling et al. |
| 2016/0216800 A1* | 7/2016 | Cho .................... G09G 3/3291 |
| 2019/0004650 A1* | 1/2019 | Ma ....................... G06F 3/0412 |

OTHER PUBLICATIONS

Intellectual Property India, Office Action, IN Patent Application No. 201914051018, dated Jun. 9, 2021, ten pages.

* cited by examiner

*Primary Examiner* — Adam R. Giesy
(74) *Attorney, Agent, or Firm* — Fenwick & West LLP

(57) ABSTRACT

A touchscreen display device is provided. The touchscreen display device comprises a plurality of gate lines, through which a gate signal is transferred; a plurality of data lines, through which a data signal is transferred; a plurality of subpixels connected to the plurality of gate lines and the plurality of data lines; a plurality of touch electrodes connected to the plurality of gate lines, and respectively storing a charging voltage in response to the gate signal; and a controller detecting a touch in response to the charging voltage stored in the plurality of touch electrodes.

16 Claims, 13 Drawing Sheets

TOUCHSCREEN DISPLAY DEVICE

CROSS-REFERENCE TO RELATED APPLICATION

This application claims the benefit of Republic of Korea Patent Application No. 10-2018-0168275, filed on Dec. 24, 2018, which is hereby incorporated by reference in its entirety.

FIELD OF THE DISCLOSURE

Embodiments relate to a touchscreen display device.

BACKGROUND

With the development of the information society, there has been increasing demand for a variety of image display devices. In this regard, a range of display devices, such as liquid crystal display (LCD) devices, plasma display devices, and organic light-emitting diode (OLED) display devices, have come into widespread use.

Such a display device can operate in response to an input signal transferred via a variety of input devices, such as a touchscreen panel, a keyboard, and a mouse. The touchscreen panel allows a user to more intuitively and conveniently input instructions to the display device by detecting a touch on a screen thereof. The touchscreen panel is disposed on the screen of the display device, and the user can input instructions to the display device by touching a specific point on the screen of the display device. In addition, the touchscreen panel is embedded in and integrated with the display device. The touchscreen panel integrated with the display device may also be referred to as a touch sensor.

In addition, when a touch sensor is included in a display device, the thickness of the display device may be increased. However, the display device is used in portable devices, such as a smartphone and a tablet computer, which should have a lightweight and thin design to improve user convenience. Thus, a solution for enabling the display device including the touch sensor to have a lightweight and thin design is demanded. In addition, a solution able to prevent the fabrication costs of the display device from being increased due to the touch sensor is also demanded.

SUMMARY

Various aspects provide a touchscreen display device having a structure able to reduce the thickness of touchscreen display device.

Also provided is a touchscreen display device having a structure able to reduce the fabrication costs of the touchscreen display device.

According to an aspect, a touchscreen display device may include: a plurality of gate lines, through which a gate signal is transferred; a plurality of data lines, through which a data signal is transferred; a plurality of subpixels connected to the plurality of gate lines and the plurality of data lines; a plurality of touch electrodes connected to the plurality of gate lines, and respectively storing a charging voltage in response to the gate signal; and a controller detecting a touch in response to the charging voltage stored in the plurality of touch electrodes.

According to another aspect, a touchscreen display device may include: a substrate including an open area and a non-open area; a conductive layer disposed on the substrate, corresponding to the open area; a circuit section disposed in the non-open area to generate a driving voltage or a driving current in response to a gate signal and a data signal; a gate line, through which the gate signal is transferred to the circuit section; a data line, through which the data signal is transferred to the circuit section; a light emitter disposed in the open area and connected to the circuit section to receive the driving voltage or the driving current; and a touch capacitor disposed between the gate line and the conductive layer.

According to exemplary embodiments, the touchscreen display device has a structure able to reduce the thickness of touchscreen display device.

According to exemplary embodiments, the touchscreen display device has a structure able to reduce the fabrication costs of the touchscreen display device.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
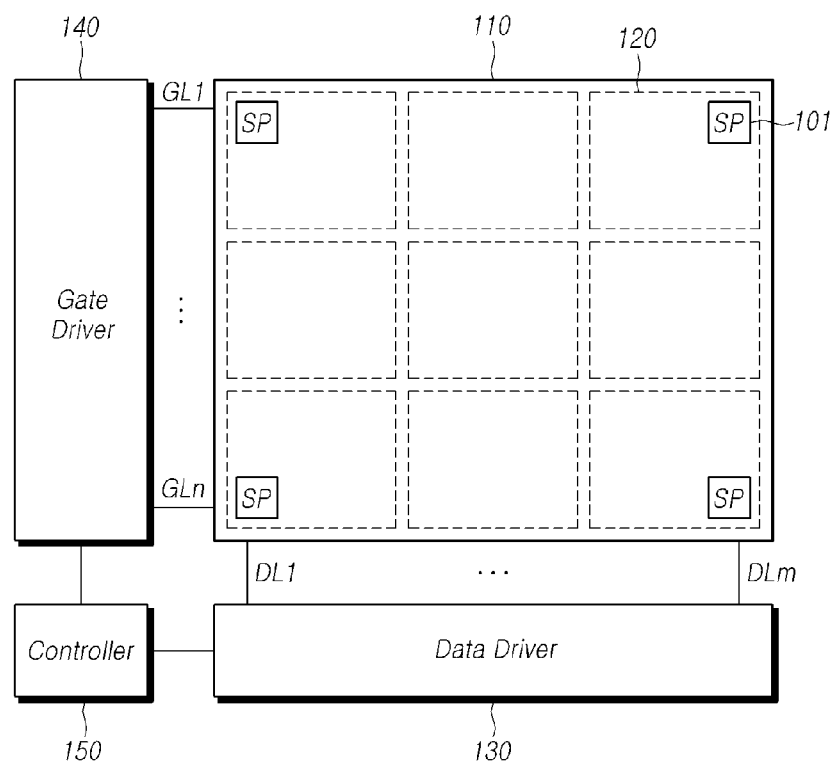
FIG. 1 illustrates a configuration of a touchscreen display device according to embodiments.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 illustrates a configuration of a touchscreen display device according to embodiments.

Referring to FIG. 1, the touchscreen display device 100 may include a touchscreen panel 110, a touch capacitor Ctouch, a data driver 130, a gate driver 140, and a controller 150.

The touchscreen panel 110 may include a plurality of data lines DL1 to DLm disposed in a first direction and a plurality of gate lines GL1 to GLn disposed in a second direction. Although the plurality of data lines DL1 to DLm and the plurality of gate lines GL1 to GLn are illustrated as intersecting each other, this is not limitative. In addition, the wiring disposed in the touchscreen panel 110 is not limited to the plurality of data lines DL1 to DLm and the plurality of gate lines GL1 to GLn.

The touchscreen panel 110 may include a plurality of subpixels 101 provided in areas corresponding to areas in which the plurality of gate lines GL1 to GLn intersect the plurality of data lines DL1 to DLm. The plurality of subpixels 101 may be provided in the form of a matrix comprised of a plurality of subpixel rows arrayed in a horizontal direction and a plurality of subpixel columns arrayed in a vertical direction. The subpixels 101 disposed in a single pixel row may be connected to a single gate line, but this is not limitative.

A touch electrode 120 may generate a touch signal including information regarding a touch point in response to a touch on the touchscreen panel 110. A plurality of touch electrodes 120 may be disposed in the touchscreen panel 110. The touch electrodes 120 may be disposed in the touchscreen panel 110. In addition, the touch electrodes 120 may be disposed on top of the touchscreen panel 110. Although the touch electrodes 120 are illustrated as being nine (9) touch electrodes herein, this is merely illustrative while not being limitative. In addition, the touch electrodes 120 may be connected to the plurality of gate lines and store a charging voltage therein in response to a gate signal.

The data driver 130 may generate a data signal by receiving an image signal and apply the generated data signal to the plurality of data lines DL1 to DLm. A voltage level of the data signal may be determined depending on the grayscale. A voltage of the data signal may be referred to as a data voltage Vdata. Although the data driver 130 is illustrated as being a single data driver herein, this is not limitative. Two or more data drivers may be provided depending on the size, resolution, and the like, of the touchscreen panel 110. In addition, the data driver 130 may be implemented as an integrated circuit (IC). The data driver 130 may receive characteristics values of the subpixels 101 from the subpixels 101 disposed in the touchscreen panel 110. In addition, the data driver 130 may convert the received characteristics values of the subpixels 101 into digital signals and output the digital signals of the characteristics values.

The gate driver 140 may sequentially apply the gate signal to the plurality of gate lines GL1 to GLn. The subpixels 101 corresponding to the plurality of gate lines GL1 to GLn, to which the gate signal is applied, may receive the data signal. Although the gate driver 140 is illustrated as being a single gate driver herein, this is not limitative, and two or more gate drivers may be provided. For example, two gate drivers may be disposed on both sides of the touchscreen panel 110, respectively, with one gate driver being connected to odd-numbered gate lines among the plurality of gate lines GL1 to GLn, and the other gate driver being connected to even-numbered gate lines among the plurality of gate lines GL1 to GLn. In addition, the gate driver 140 may include a gate signal generator circuit and a level shifter applying at least one of a signal, a voltage, or a combination thereof, to the gate signal generator circuit. In addition, the gate signal generator circuit may be disposed on the touchscreen panel 110.

In addition, although the gate driver 140 is illustrated as the plurality of gate lines GL1 to GLn being only connected thereto, signals output by the gate driver 140 are not limited to the gate signal.

The controller 150 may control the data driver 130 and the gate driver 140. In addition, the controller 150 may transfer the image signal to the data driver 130. The image signal may be a digital signal. In addition, the controller 150 may correct the image signal before transferring the image signal to the data driver 130. The controller 150 can receive the characteristics values of the subpixels 101 from the data driver 130 to correct the image signal.

In addition, the controller 150 may determine a touch point in response to a touch signal generated by the touch electrodes 120. The controller 150 may detect a touch in response to a voltage charged in the touch electrodes 120. Although the controller 150 is illustrated as being a single component herein, this is not limitative. The controller 150 may include a timing controller controlling the data driver 130 and the gate driver 140 and a micro control unit (MCU) producing information regarding a touch location. However, the configuration of the controller 150 is not limited thereto.

Figure 2:
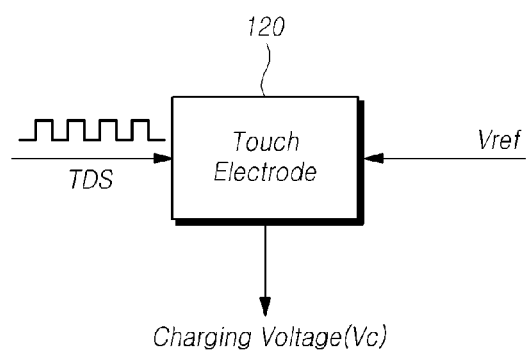
FIG. 2 is a conceptual diagram illustrating touch detection performed by a touch electrode according to embodiments.
Figure 3:
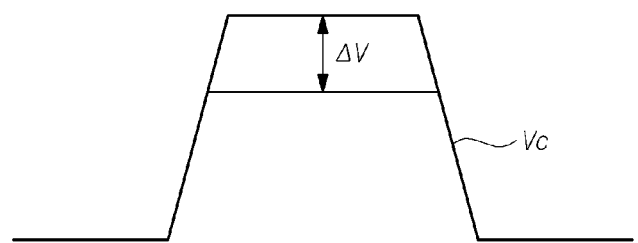
FIG. 3 is a waveform diagram illustrating a voltage charged in the touch electrode illustrated in FIG. 2.

FIG. 2 is a conceptual diagram illustrating touch detection performed by a touch electrode according to embodiments, and FIG. 3 is a waveform diagram illustrating a voltage charged in the touch electrode illustrated in FIG. 2.

Referring to FIG. 2, the touch electrode 120 may receive a touch driving signal TDS and a reference voltage Vref. That is, the touch electrode 120 may receive the touch driving signal TDS through a first end while receiving the reference voltage Vref through a second end. When the second end of the touch electrode 120 is floated after the reference voltage Vref is transferred thereto, the first end of the touch electrode 120 may receive the touch driving signal TDS.

The touch driving signal TDS may include a plurality of clocks. Thus, in response to the touch driving signal TDS being transferred through the first end, the touch electrode 120 can be repeatedly charged and discharged, and can be charged with a voltage. When the touch electrode 120 is touched in a state in which the touch electrode 120 is charged with a charging voltage Vc, a portion of the charging voltage Vc of the touch electrode 120 is caused to leak outwardly due to the touch. As illustrated in FIG. 3, the charging voltage Vc in this situation may have a difference ΔV from the charging voltage Vc in which no touch has occurred. In addition, the difference ΔV may be transferred to the controller 150, which in turn may determine the occurrence and intensity of the touch by a calculation on the basis of the difference ΔV.

Figure 4:
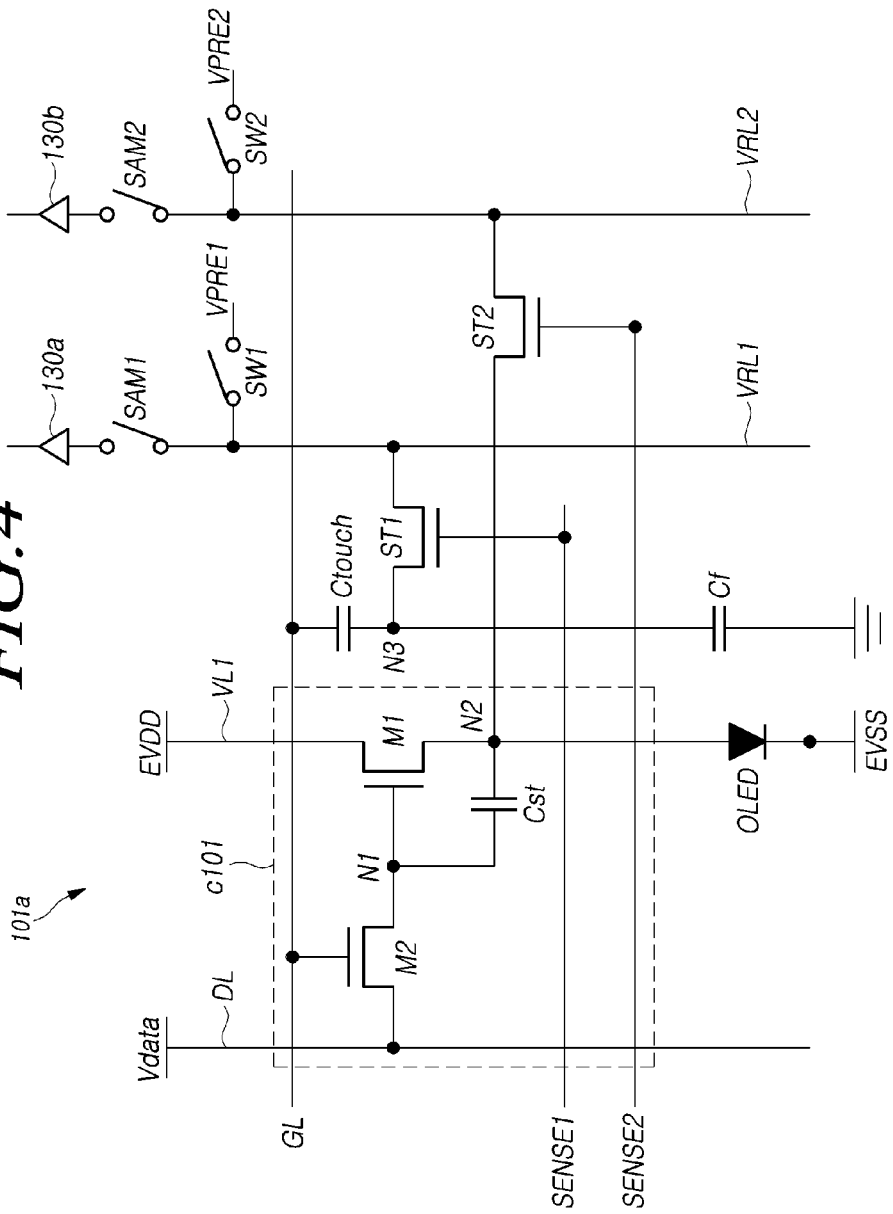
FIG. 4 is a circuit diagram illustrating a subpixel and a touch electrode according to embodiments.

FIG. 4 is a circuit diagram illustrating a subpixel and a touch electrode according to embodiments.

Referring to FIG. 4, the subpixel 101*a* may include an organic light-emitting diode OLED and a subpixel circuit c101. The subpixel circuit c101 may include a first transistor M1 supplying a driving current in response to a data signal, a second transistor transferring the data signal to the first transistor M1 in response to a gate signal, and a storage capacitor Cst maintaining the data signal. In addition, the organic light-emitting diode OLED can generate light by receiving the driving current from the first transistor M1.

A touch capacitor Ctouch, connected to a gate line GL, may be connected to subpixel 101*a*. The touch capacitor Ctouch may be a portion of the touch electrode 120 illustrated in FIG. 2. In a situation in which the touch electrode 120 is connected within the subpixel circuit c101 using the touch capacitor Ctouch, the touch electrode 120 can be disposed in the touchscreen panel 110 in a simple manner, and an increase in the thickness of the touchscreen panel 110 can be minimized.

The first transistor M1 may have a gate electrode connected to a first node N1, a first electrode connected to a first power line EVDD, and a second electrode connected to a second node N2. The second transistor M2 may have a gate electrode connected to the gate line GL, a first electrode connected to a data line, and a second electrode connected to the first node N1. The storage capacitor Cst may have a first electrode connected to the first node N1 and a second electrode connected to the second node N2. In addition, the organic light-emitting diode OLED may have an anode connected to the second node N2 and a cathode connected to a second power line EVSS.

The first transistor M1 can supply the driving current to the second node N2 in response to the data voltage Vdata responding to the data signal transferred to the first node N1. In addition, the second transistor M2 can supply the data signal to the first node N1 in response to the gate signal being transferred to the gate line GL. The storage capacitor Cst can maintain a voltage between the first node N1 and the second node N2, thereby causing the driving current flowing due to the voltage between the first node N1 and the second node N2 to be constant. The organic light-emitting diode OLED can generate light in response to the driving current being supplied from the second node N2.

In addition, the touch capacitor Ctouch may have a first electrode connected to the gate line GL and a second electrode connected to a first reference voltage line VRL1. In addition, a first switching transistor ST1 may be disposed between the second electrode of the touch capacitor Ctouch and the first reference voltage line VRL1. The first switching transistor ST1 may have a gate electrode connected to a first sensing signal line SENSE1, a first electrode connected to a third node N3, and a second electrode connected to the first reference voltage line VRL1.

In addition, the second electrode of the touch capacitor Ctouch may be connected to the third node N3, such that the second electrode of the touch capacitor Ctouch may be connected to the first reference voltage line VRL1 via the first switching transistor ST1. Although the touch capacitor Ctouch is illustrated as being connected to a single gate line GL herein, this is not limitative. The touch capacitor Ctouch may be connected to one or more adjacent gate lines (not shown).

In addition, a second switching transistor ST2 may further be connected to the subpixel 101*a*. The second switching transistor ST2 may transfer a second reference voltage VPRE2 from a second reference voltage line VRL2 to the storage capacitor Cst, and may transfer a voltage, charged in the storage capacitor Cst, to the second reference voltage line VRL2. The second switching transistor ST2 may have a gate electrode connected to a second sensing signal line SENSE2, a first electrode connected to the second node N2, and a second electrode connected to the second reference voltage line VRL2.

A first sampling switch SAM1 and a first switch SW1 may be connected to the first reference voltage line VRL1, and a second sampling switch SAM2 and a second switch SW2 may be connected to the second reference voltage line VRL2. The first switch SW1 can transfer a first reference voltage VPRE1 to the first reference voltage line VRL1, while the second switch SW2 can transfer a second reference voltage VPRE2 to the second reference voltage line VRL2. In addition, the first switching transistor ST1 can transfer the first reference voltage VPRE1, transferred to the first reference voltage line VRL1, to the third node N3, while the second switching transistor ST2 can transfer the second reference voltage VPRE2, transferred to the second reference voltage line VRL2, to the second node N2. In addition, the first switching transistor ST1 can transfer a voltage of the third node N3 to the first reference voltage line VRL1, while the second switching transistor ST2 can transfer a voltage of the second node N2 to the second reference voltage line VRL2.

The first sampling switch SAM1 and the second sampling switch SAM2 may be connected to analog-to-digital converters 130*a* and 130*b*, respectively. The first sampling switch SAM1 may be connected to the first analog-to-digital converter 130*a*, while the second sampling switch SAM2 may be connected to the second analog-to-digital converters 130*b*. However, this is not limitative, and the first sampling switch SAM1 and the second sampling switch SAM2 may be connected to a single analog-to-digital converter 130*a* or 130*b*. The first analog-to-digital converter 130*a* and the second analog-to-digital converter 130*b* may be included in the data driver 130 illustrated in FIG. 1. However, this is not limitative.

The first switch SW1, the second switch SW2, the first sampling switch SAM1, and the second sampling switch SAM2 can control turning-on and turning-off in the controller 150. However, this is not limitative. In addition, the first sensing signal line SENSE1 and the second sensing signal line SENSE2 may be connected to the gate driver 140. In addition, when the touchscreen panel 110 is touched, a common capacitor Cf can be generated between the third node N3 and the ground, due to the touch. A charging voltage Vc, charged in the touch capacitor Ctouch, can be changed by the common capacitor Cf. Such a change in the charging voltage Vc can be transferred to the analog-to-digital converter 130*a* through the first switching transistor ST1 and the first reference voltage line VRL1.

Figure 5:
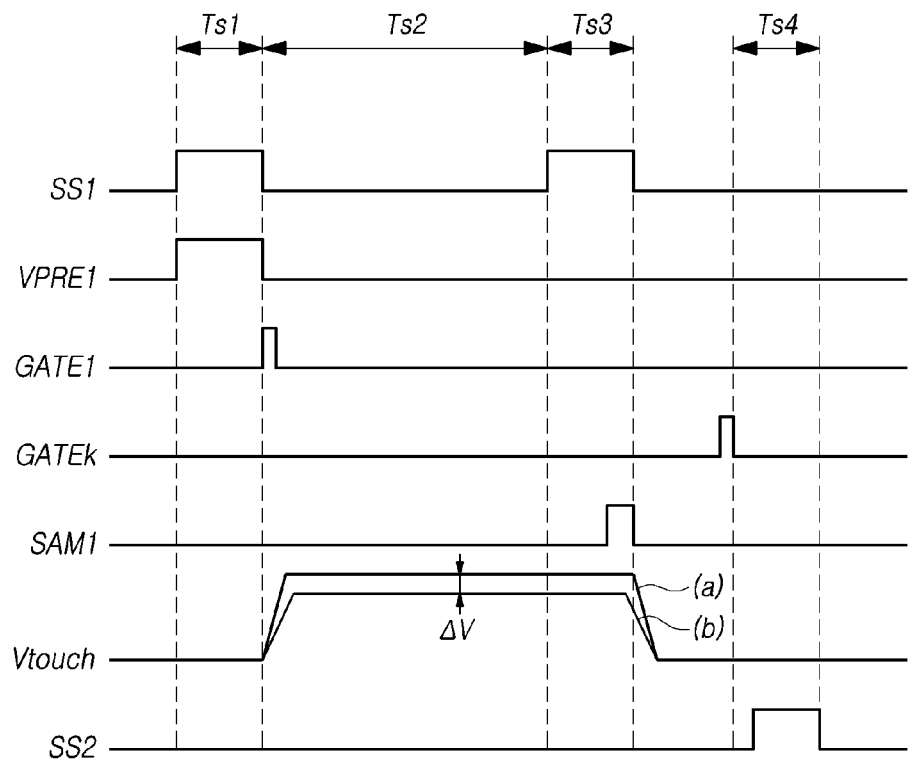
FIG. 5 is a timing diagram illustrating a touch detection operation of the subpixel illustrated in FIG. 4.

FIG. 5 is a timing diagram illustrating a touch detection operation of the subpixel illustrated in FIG. 4.

Referring to FIG. 5, the subpixel 101 can receive a first sensing signal SS1 through the first sensing signal line SENSE1 in a first period Ts1. The first switching transistor ST1 can be turned on. In addition, the first switch SW1 can be turned on. Accordingly, in the first period Ts1, the first switching transistor ST1 and the first switch SW1 can be simultaneously turned on. However, this is not limitative, an interval of the first period, in which the first switching transistor ST1 is turned on, may overlap with (a portion of) an interval of the first period, in which the first switch SW1 is turned on. When the first switching transistor ST1 and the first switch SW1 are turned on, the first reference voltage VPRE1 can be transferred to the third node N3 to which the second electrode of the touch capacitor Ctouch is connected.

In addition, after the first reference voltage VPRE1 is transferred to the third node N3 in a second period Ts2, the first switching transistor ST1 and the first switch SW1 can be turned off. After the first switching transistor ST1 and the first switch SW1 are turned off, a first gate signal GATE1 can be transferred through the gate line GL. At this time, the touch capacitor Ctouch can be connected to a plurality of gate lines GL, and can sequentially receive a plurality of gate signals GATE1 to GATEk directed to the plurality of gate lines GL. Accordingly, a signal including a plurality of clocks, such as the touch driving signal TDS illustrated in FIG. 2, can be transferred to the first electrode of the touch capacitor Ctouch. In addition, the second electrode of the touch capacitor Ctouch can be in a floated state, and the touch capacitor Ctouch can be repeatedly charged and discharged due to the plurality of gate signals GATE1 to GATEk, so that a voltage can be applied to the touch capacitor Ctouch.

In addition, in a third period Ts3, the first switching transistor ST1 can be turned on by a first sensing signal SS1 transferred thereto through the first sensing signal line SENSE1. In addition, after the first switching transistor ST1 is turned on, the first sampling switch SAM1 can be turned on. Here, since the touch capacitor Ctouch has a voltage applied thereto, the voltage of the second electrode of the touch capacitor Ctouch can be output. That is, the voltage of the third node N3, to which the second electrode of the touch capacitor Ctouch is connected, can be output to the first analog-to-digital converter 130a through the first reference voltage line VRL1. The first analog-to-digital converter 130a can convert the voltage of the third node N3 of the touch capacitor Ctouch into a digital signal and transfer the converted digital signal to the controller 150.

In addition, in a fourth period Ts4, the second switching transistor ST2 can be turned on by a second sensing signal SS2 transferred thereto through the second sensing signal line SENSE2. When the second switching transistor ST2 is turned on, a voltage applied to the second node N2 may be transferred to the second reference voltage line VRL2. Here, the second switch SW2 and the second sampling switch SAM2 can be turned on to transfer the voltage, applied to the second node N2, to the second analog-to-digital converter 130b. Accordingly, characteristics values of the subpixel 101 can be transferred to the second analog-to-digital converter 130b, so that the characteristics values can be compensated for. The compensation of the characteristics values can be performed by the controller 150.

Although each of the plurality of gate signals GATE1 to GATEk is illustrated as having a single clock herein, this is not limitative. Rather, each of the plurality of gate signals GATE1 to GATEk may include a plurality of clocks. In a situation in which each of the plurality of gate signals GATE1 to GATEk includes a plurality of clocks, the difference between voltages charged in and discharged from the touch capacitor Ctouch can be increased.

Figure 6:
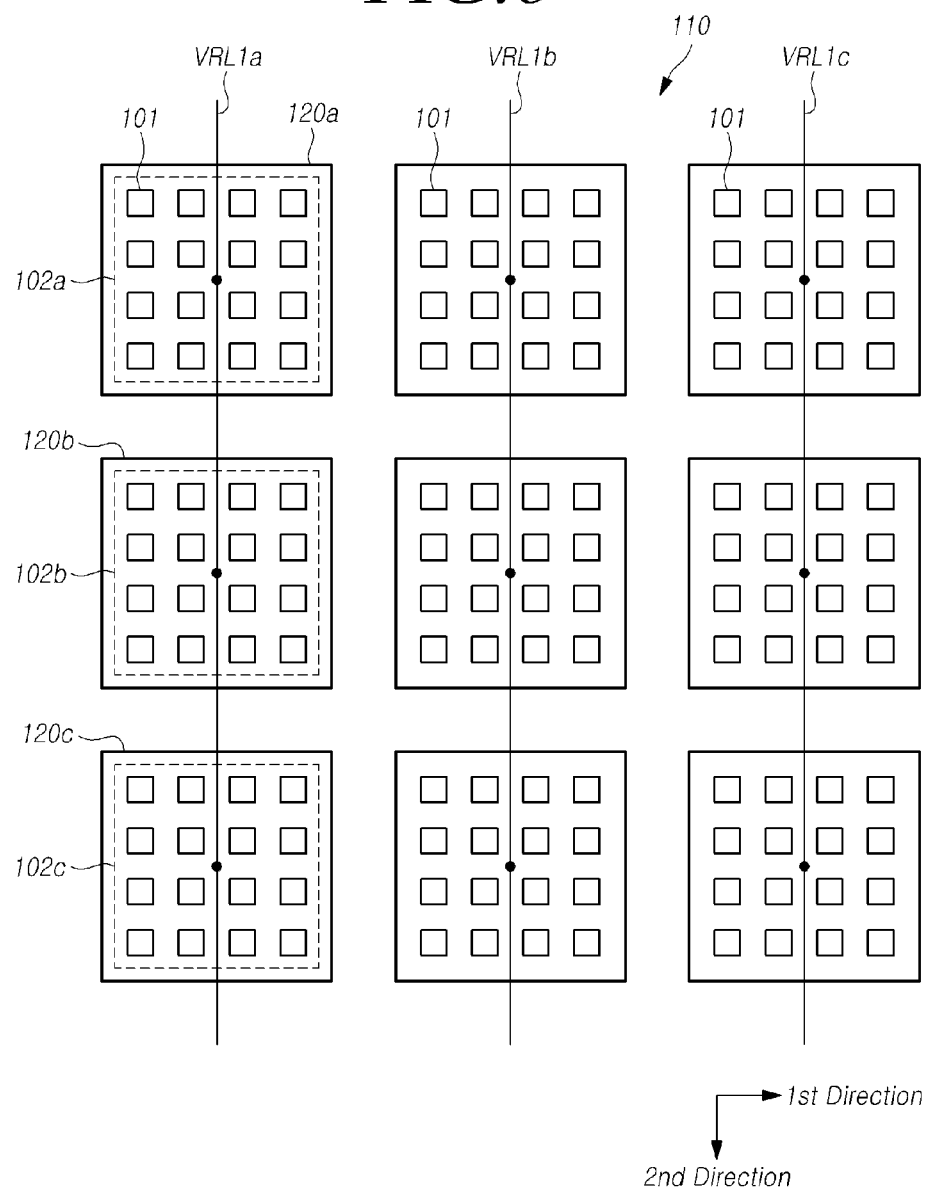
FIG. 6 is a top view illustrating an array of touch electrodes and pixels according to embodiments.

FIG. 6 is a top view illustrating an array of touch electrodes and pixels according to embodiments.

Referring to FIG. 6, the touchscreen panel 110 may include a plurality of touch electrodes 120 and a plurality of touch lines VRL1a, VRL1b, and VRL1c. Although nine (9) touch electrodes 120 are illustrated as being disposed on the touchscreen panel 110 herein, this is not limitative. The first touch electrode 120a may be connected to the first touch line VRL1a extending in a second direction. In addition, the second touch electrode 120b and the third touch electrode 120c, arrayed in a second direction with respect to the first touch electrode 120a, may be connected to the first touch line VRL1a. In addition, three touch electrodes may be connected to each of the other touch lines VRL1b and VRL1c in the second direction. The touch lines VRL1b and VRL1c may be respectively a signal line, through which a signal corresponding to a touch is transferred, corresponding to the first reference voltage line VRL1 illustrated in FIG. 4.

The plurality of subpixels 101 may be disposed in the touchscreen panel 110, corresponding to the touch electrodes 120. For example, sixteen (16) subpixels may correspond to the first touch electrode 120a. The plurality of subpixels 101 may include subpixels 101 respectively emitting red light, blue light, green light, or white light. The colors of light emitted by the subpixels 101 are not limited thereto. The subpixels corresponding to the first touch electrode 120a may be referred to as a group of subpixels or a subpixel group 102a. That is, the touch electrodes 120a, 120b, and 120c may correspond to subpixel groups 102a, 102b, and 102c, respectively. In addition, a plurality of first sensing signal lines (not shown) may be disposed in the touchscreen panel 110.

Figure 7:
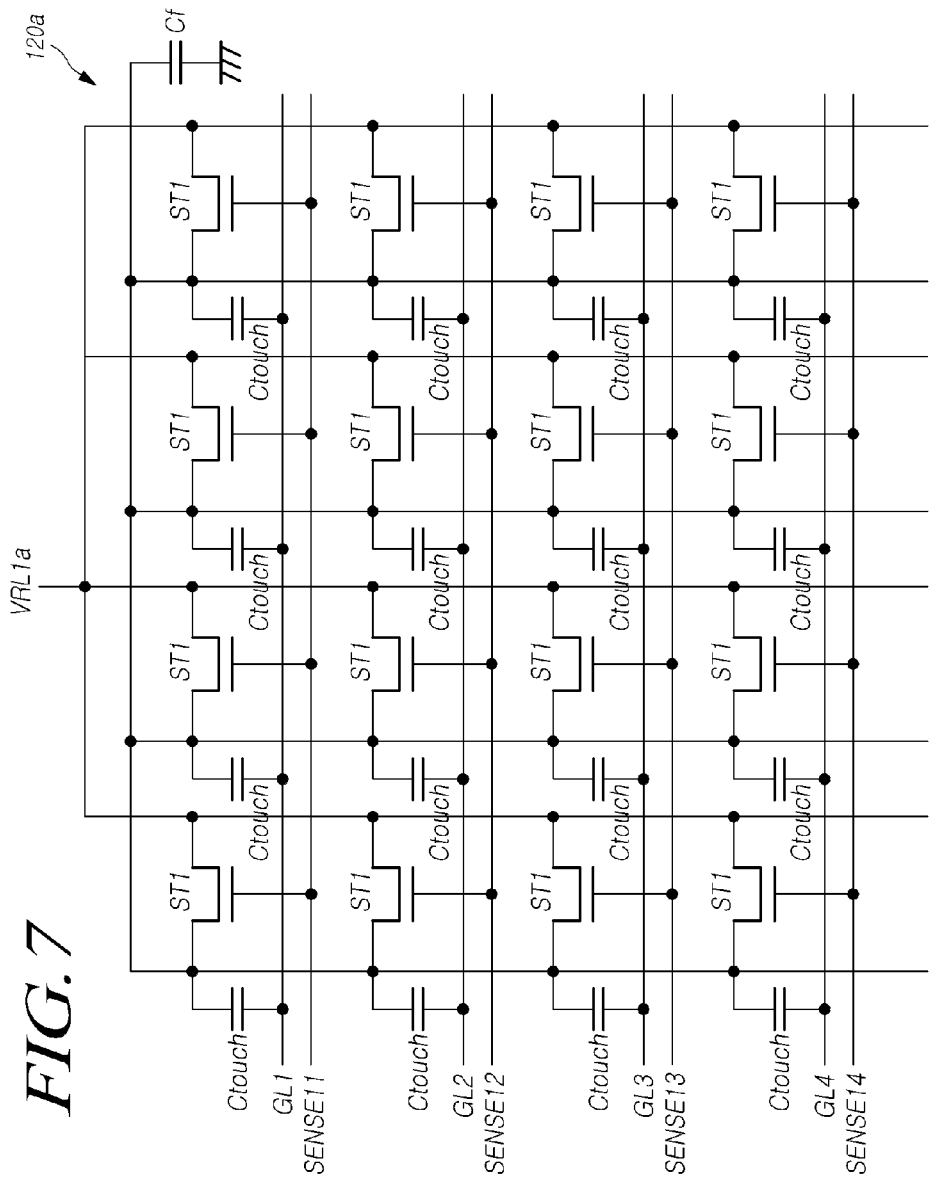
FIG. 7 is a top view illustrating the connection relationship of touch capacitors connected to the plurality of subpixels corresponding to the first subpixel group according to embodiments.

FIG. 7 is a top view illustrating the connection relationship of touch capacitors connected to the plurality of subpixels corresponding to the first subpixel group according to embodiments.

Referring to FIG. 7, the touch capacitors Ctouch may be connected to the plurality of subpixels 101 corresponding to the first touch electrode 120a. Although the sixteen subpixels are illustrated as corresponding to the first touch electrode 120a herein, the number of the subpixels is not limited thereto.

In addition, the first electrodes of the plurality of touch capacitors Ctouch may be connected to a common capacitor Cf. The common capacitor Cf can be generated by a touch. In addition, the first electrodes of the touch capacitors Ctouch may be connected to gate lines GL1 to GL4, respectively, while the second electrodes of the touch capacitors Ctouch may be connected to the first electrode of the common capacitor Cf. The second electrodes of the touch capacitors Ctouch may be connected to a first reference voltage line VRL1a through first switching transistors ST1.

Since the plurality of subpixels 101 of the first subpixel group 102a are connected to the four gate lines GL1 to GL4, the common capacitor Cf may be connected to the four gate lines GL1 to GL4. Thus, four (4) clocks can be transferred to the first electrode of the common capacitor Cf. However, the number of the gate lines connected to the common capacitor Cf is illustrative while not being limitative.

In addition, the plurality of subpixels 101 corresponding to the first subpixel group 102a corresponding to the first touch electrode 120a may be connected to the first switching transistors ST1, respectively. Each of the first switching transistors ST1 may be connected to four sensing lines SENSE1 to SENSE4. In response to sensing signals being transferred to the four sensing lines SENSE1 to SENSE4, charging voltages, stored in the touch capacitors Ctouch, can be transferred to the touch line VRL1a. Points in time, at which the charging voltages of the touch capacitors Ctouch and the common capacitor Cf, corresponding to the first touch electrode 120a, are to be transferred, can be determined by the four sensing lines SENSE1 to SENSE4.

Accordingly, the plurality of touch electrodes can be connected to the single first touch line VRL1a.

Figure 8:
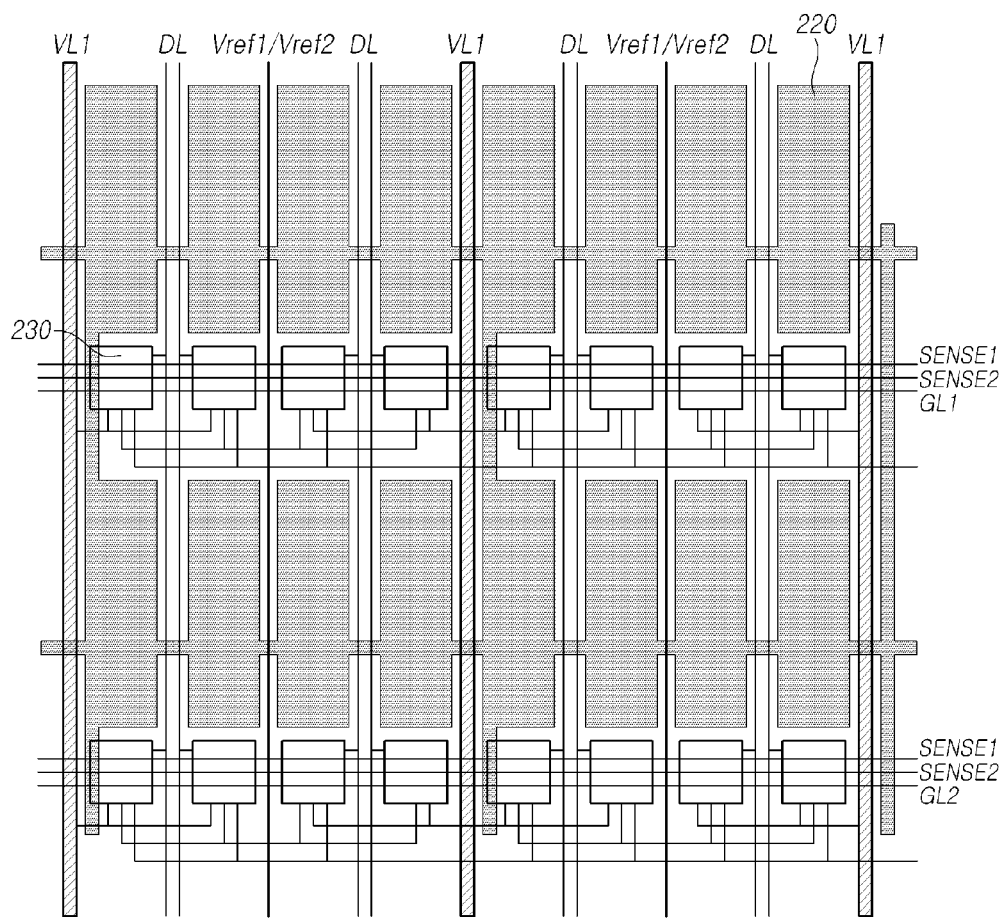
FIG. 8 is a layout diagram of the display panel according to embodiments.

FIG. 8 is a layout diagram of the display panel according to embodiments.

Referring to FIG. 8, a plurality of gate lines GL, a plurality of first sensing signal lines SENSE1, and a plurality of second sensing signal line SENSE2 may be disposed on the touchscreen panel 110 in a first direction, and a plurality of data lines DL, a plurality of first power lines VL1, a plurality of first reference voltage lines VRL1, a plurality of second reference voltage lines VRL2 may be disposed on the touchscreen panel 110 in a second direction. In addition, circuit sections 230 may be disposed in areas in which the plurality of data lines DL intersect the plurality of gate lines GL. Although the circuit sections 230 are schematically illustrated as having a rectangular shape, this is not limitative. The subpixel circuit c101 of the subpixel 101, as illustrated in FIG. 4, may be disposed in each of the circuit sections 230. However, the subpixel circuit c101 disposed in each of the circuit sections 230 is not limited thereto. The circuit sections 230 can receive a gate signal through the gate lines GL, and can receive a data signal through the data lines DL.

In addition, a conductive layer 220 may be provided. The conductive layer 220 may be provided to correspond to emission areas in which organic light-emitting diodes are disposed. For example, the conductive layer 220 may be disposed to overlap the emission areas. However, this is not limitative, but the conductive layer 220 may be disposed to overlap a portion of the emission areas. In addition, the conductive layer 220 may be connected to another conductive layer corresponding to the same touch electrode. In addition, the touch capacitors Ctouch may be disposed between the gate lines GL and the conductive layer 220.

The conductive layer 220 may be a transparent electrode. For example, the conductive layer 220 may be made of indium tin oxide (ITO), but this is not limitative. The conductive layer 220 may correspond to the first electrode of the common capacitor Cf illustrated in FIG. 7. In addition, when at least one of a finger, a pen (e.g. a stylus pen), or a combination thereof, touches the touchscreen panel 110, the common capacitor Cf can be generated between the conductive layer 220 and at least one of the finger, the pen, or the combination thereof.

Figure 9:
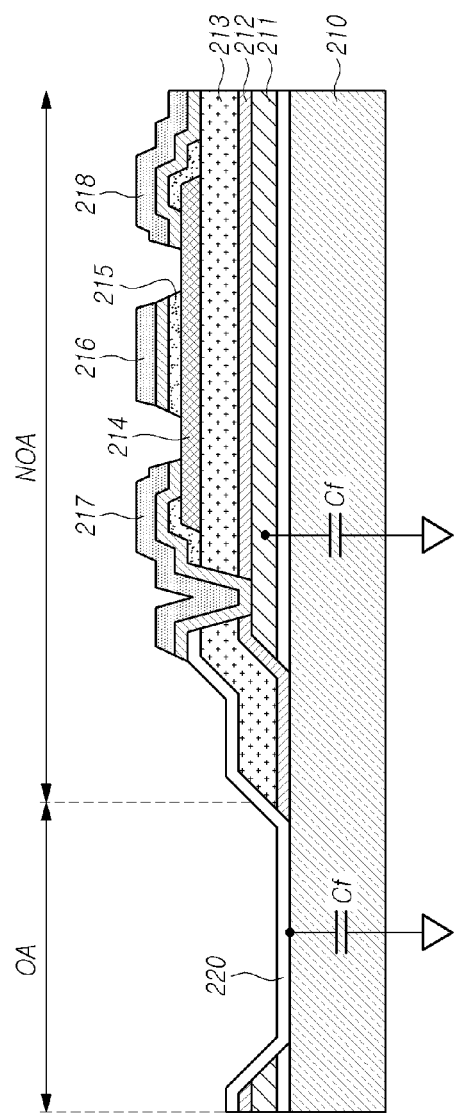
FIG. 9 a cross-sectional view illustrating the subpixel according to embodiments.

FIG. 9 a cross-sectional view illustrating the subpixel according to embodiments.

Referring to FIG. 9, a substrate 210 includes an open area OA and a non-open area NOA. In the subpixel 101, the conductive layer 220 may be disposed on a portion of the substrate 210, corresponding to the open area OA. The circuit section 230 illustrated in FIG. 8 may be disposed in the non-open area NOA to generate a driving voltage or a driving current in response to a gate signal and a data signal. The open area OA may correspond to each of the emission areas overlapping the conductive layer 220 in FIG. 8.

In the circuit section 230, a conductive layer 211 may be disposed on the substrate 210, and a first insulating layer 212 and a second insulating layer 213 may be disposed on top of the conductive layer 211. The conductive layer 211 may have a dual-layer structure. In addition, an active layer 214 may be disposed on top of the second insulating layer 213, in a location overlapping the conductive layer 211. In addition, a gate insulating layer 215 may be disposed on top of the active layer 214, and a gate electrode 216 may be disposed on top of the gate insulating layer 215 to overlap the active layer 214. In addition, a first electrode 217 and a second electrode 218 may be disposed in contact with the active layer 214.

In addition, the first electrode 217 may be connected to the conductive layer 211, disposed below the first insulating layer 213, through a contact hole. The gate electrode 216, the first electrode 217, the second electrode 218, and the active layer 214 may correspond to the first switching transistor ST1 illustrated in FIG. 3. Each of the gate electrode 216, the first electrode 217, and the second electrode 218 may have a dual-layer structure. However, this is not limitative. In addition, a portion of the conductive layer 220 disposed in the active area OA may be connected to the first electrode 217 while being located on the first insulating layer 213.

In addition, when an object touches a rear surface of the substrate 210, a common capacitor Cf can be generated between a conductor, i.e. the conductive layer 220 and the conductive layer 211, and the object. The conductive layer 220 and the conductive layer 211 may correspond to the first electrode of the common capacitor Cf illustrated in FIG. 6.

Figure 10:
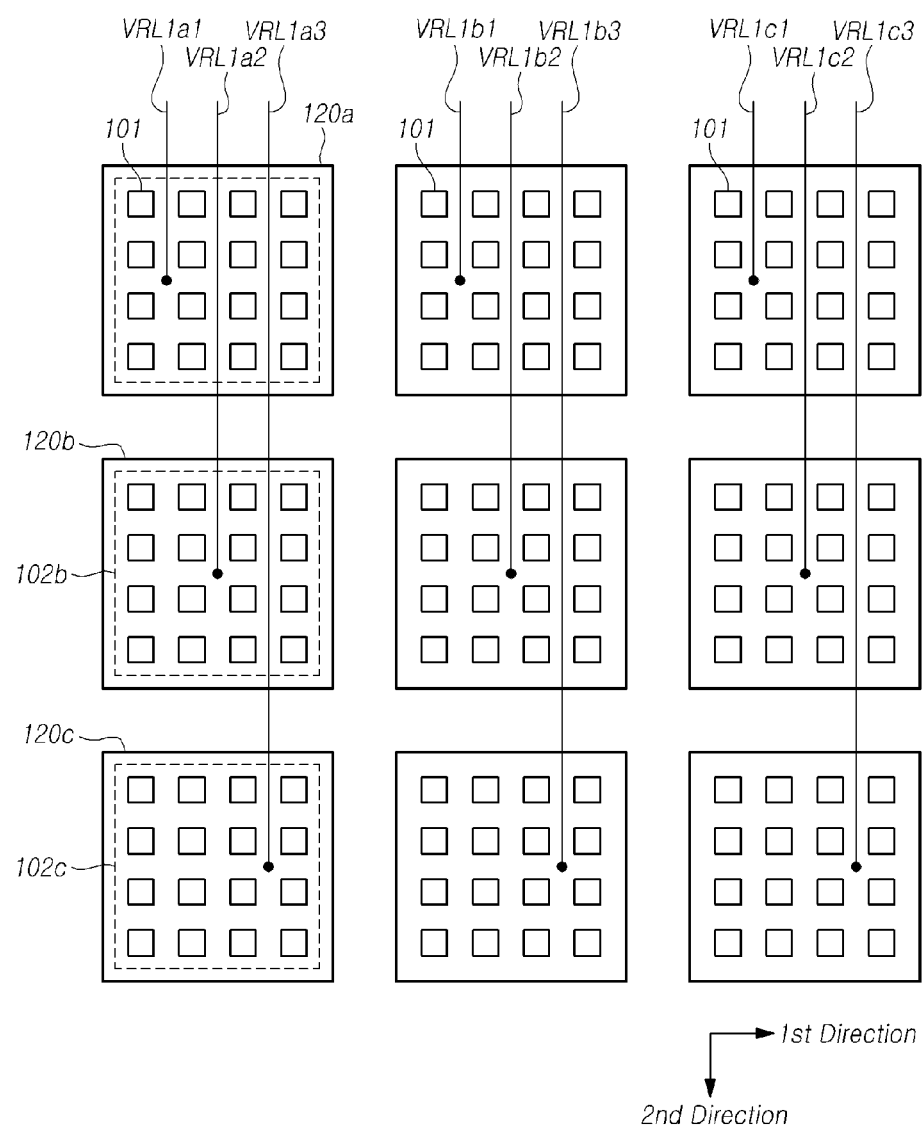
FIG. 10 is a top view illustrating an array of touch electrodes and pixels according to embodiments.

FIG. 10 is a top view illustrating an array of touch electrodes and pixels according to embodiments.

Referring to FIG. 10, the touchscreen panel 110 may include a plurality of touch electrodes 120 and a plurality of touch lines VRL1a1 to VRL1a3, VRL1b1 to VRL1b3, and VRL1c1 to VRL1c3. The touch lines VRL1a1 to VRL1a3, VRL1b1 to VRL1b3, and VRL1c1 to VRL1c3 may be signal lines, through which a signal corresponding to a touch is transferred, corresponding to the first reference voltage line VRL1. The second touch electrode 120b and the third touch electrode 120c may be disposed in a second direction, with respect to the first touch electrode 120a. The touch lines VRL1a1 to VRL1a3, VRL1b1 to VRL1b3, and VRL1c1 to VRL 1c3 may be disposed in the second direction. The first touch electrode 120a may be connected to the first touch line VRL1a1 extending in the second direction, the second touch electrodes 120b may be connected to the second touch lines VRL1a2, VRL1b2, and VRL1c2 extending in the second direction, and the third touch electrode 120c may be connected to the third touch line VRL1a3, VRL1b3, and VRL1c3.

That is, the first touch electrode 120a, the second touch electrode 120b, and the third touch electrode 120c may be connected to different touch lines. Accordingly, the number of the touch lines may be increased.

The touchscreen panel 110 may be configured such that the plurality of subpixels 101 correspond to a single touch electrode 120a. The plurality of subpixels 101 may include subpixels respectively emitting red light, blue light, green light, or white light. The colors of light emitted by the subpixels 101 are not limited thereto. A plurality of subpixels corresponding to each of the touch electrodes 120a, 120b, and 120c may be referred to as a subpixel group 102a, 102b, or 102c. In the touchscreen panel 110, a plurality of subpixel groups 102a, 102b, and 102c corresponding to the touch electrodes 120a, 120b, and 120c may be disposed. The subpixel 101 of each of the subpixel groups 102a, 102b, and 102c may not include the first switching transistor ST1, unlike the subpixel 101a illustrated in FIG. 4.

Accordingly, the structure of the subpixel 101a can be further simplified while the number of the touch lines is increased.

Figure 11:
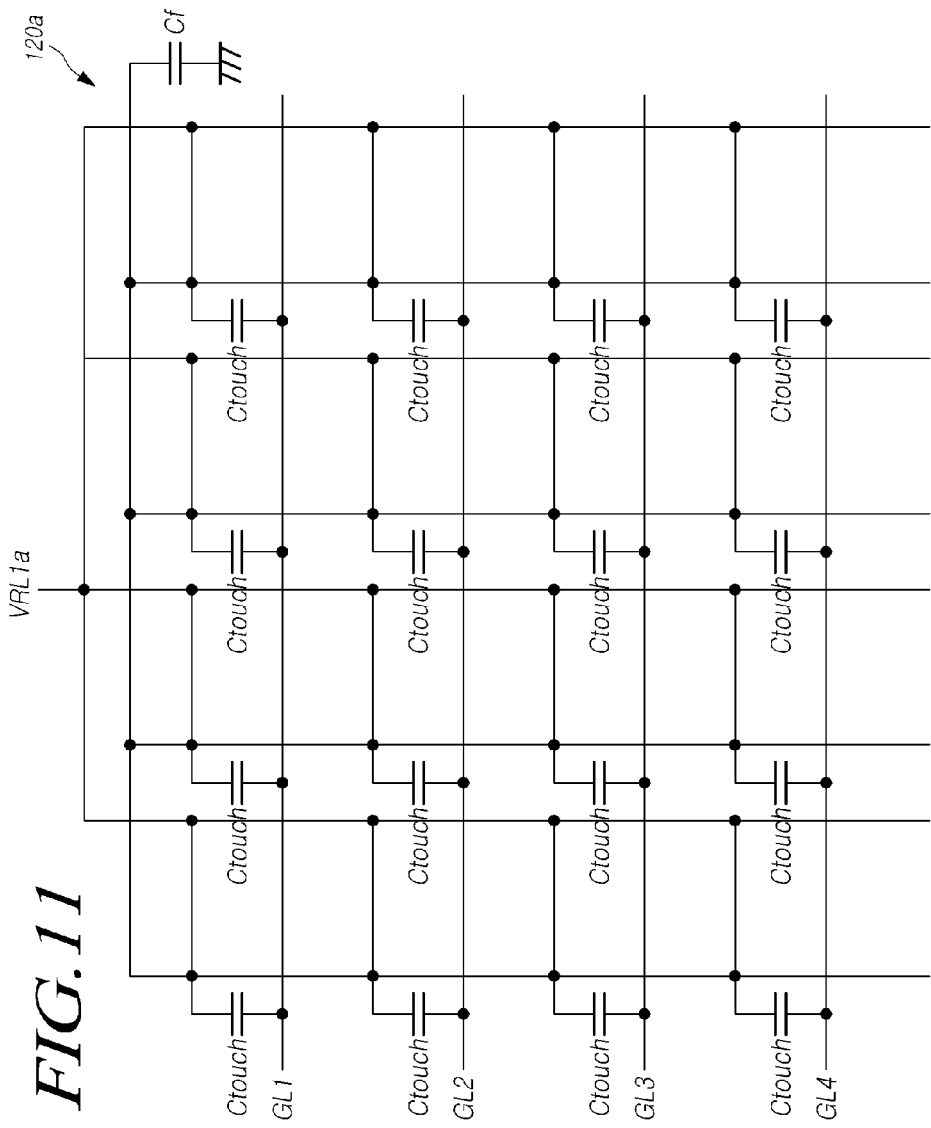
FIG. 11 is a top view illustrating the connection relationship of touch capacitors connected to the plurality of subpixels corresponding to the first subpixel group according to embodiments.

FIG. 11 is a top view illustrating the connection relationship of touch capacitors connected to the plurality of subpixels corresponding to the first subpixel group according to embodiments.

Referring to FIG. 11, the plurality of subpixels 101 of the first subpixel group 102a corresponding to the first touch electrode 120 may respectively include a touch capacitor Ctouch. Although the first subpixel group 102a is illustrated as including the sixteen subpixels 101, this is not limitative.

In addition, the first electrodes of the plurality of touch capacitors Ctouch may be connected to a common capacitor Cf. In addition, the first electrodes of the touch capacitors Ctouch may be connected to gate lines GL1 to GL4, respectively, while the second electrodes of the touch capacitors Ctouch may be connected to the first electrode of the common capacitor Cf. Since the plurality of subpixels 101 of the first subpixel group 102a are connected to the four gate lines GL1 to GL4, the common capacitor Cf may be connected to the four gate lines GL1 to GL4. Thus, 4 clocks can be transferred to the first electrode of the common capacitor Cf. In addition, the plurality of touch capacitor Ctouch of the first touch electrode 120a, as well as the common capacitor Cf, are only connected to the first reference voltage line VRL1a, but none of the other touch electrodes 120b and 120c are connected to the first reference voltage line VRL1a. Accordingly, the first switching transistor ST1 is not required to be connected to thereto, unlike the configuration illustrated in FIG. 7.

Figure 12:
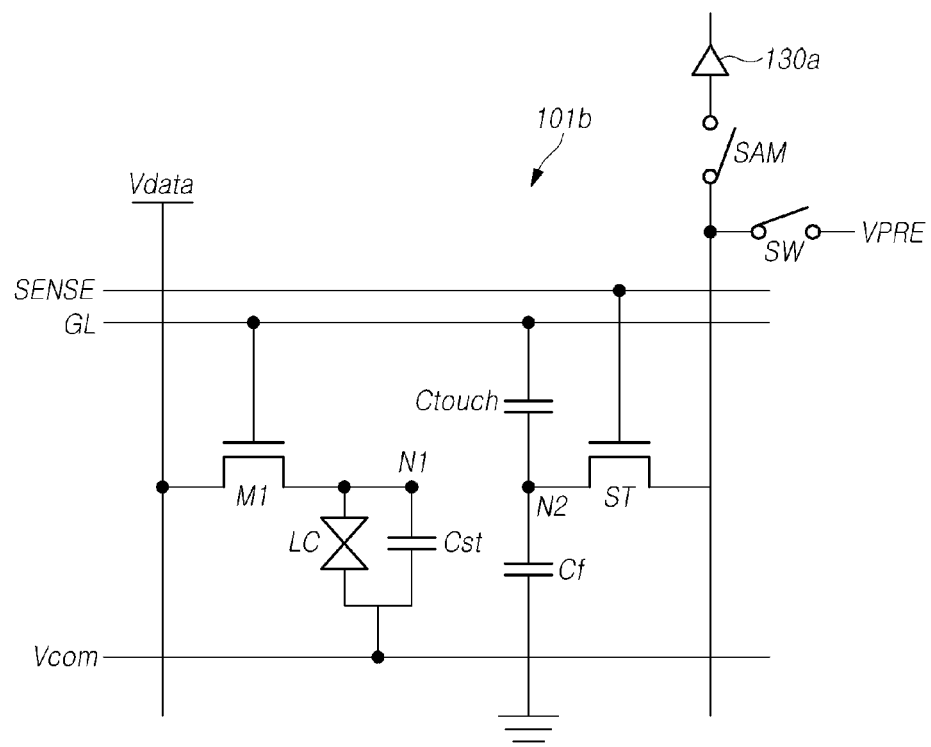
FIG. 12 is a circuit diagram illustrating an embodiment of the subpixel employed in the touchscreen display device illustrated in FIG. 1.

FIG. 12 is a circuit diagram illustrating an embodiment of the subpixel employed in the touchscreen display device illustrated in FIG. 1.

Referring to FIG. 12, the subpixel 101b may include a first transistor M1, a storage capacitor Cst, and a liquid crystal LC. The first transistor M1 may have a gate electrode connected to a gate line GL, a first electrode connected to a data line DL, and a second electrode connected to a first node N1. The storage capacitor Cst may have a first electrode connected to the first node N1 and a second electrode connected to a power line, through which a common voltage Vcom is transferred. A pixel electrode may be disposed on one side, of the liquid crystal LC, connected to the first node N1, while a common electrode may be disposed on the other side of the liquid crystal LC. The common electrode may be connected to the power line, through which the common voltage Vcom is transferred. Accordingly, the liquid crystal LC may be connected to the storage capacitor Cst in parallel.

The first transistor M1 can cause a data signal, transferred through the data line, to be transferred to the first node N1, in response to a gate signal transferred through the gate line GL, so that a data voltage corresponding to the data signal can be output. The data voltage, transferred to the first node N1, can be maintained by the storage capacitor Cst, and the liquid crystal LC can operate in response to the data voltage.

In addition, the subpixel 101b may include a switching transistor ST and a touch capacitor Ctouch. The switching transistor ST may have a gate electrode connected to a sensing signal line SENSE, a first electrode connected to a second node N2, and a second electrode connected to a reference voltage line VRL. In addition, the touch capacitor Ctouch may have a first electrode connected to the gate line GL and a second electrode connected to the second node N2.

In addition, the gate signal, transferred through the gate line GL, can be transferred to the first electrode of the touch capacitor Ctouch. Although the touch capacitor Ctouch is illustrated as being connected to the single gate line GL herein, this is not limitative. A plurality of gate lines may be connected to the first electrode of the touch capacitor Ctouch. Accordingly, the touch capacitor Ctouch can receive a touch driving signal having a plurality of pulses, like the touch driving signal TDS illustrated in FIG. 2, as the gate signal transferred through the plurality of gate lines.

In addition, a switch SW and a sampling switch SAM may further be disposed on a first reference voltage line VRL1 connected to the subpixel 101b. The switch SW can transfer a reference voltage VPRE, and the sampling switch SAM can connect an analog-to-digital converter 130a and the first reference voltage line VRL1.

When the switch SW and the switching transistor ST are turned on, the reference voltage VPRE can be transferred to the second node N2. The switch SW and the switching transistor ST can be turned off. Gate signals can be transferred to the first electrode of the touch capacitor Ctouch through the plurality of gate lines. Here, the touch capacitor Ctouch can be repeatedly charged and discharged by the plurality of gate signals so as to be charged with a voltage.

In addition, when a touch has occurred, the common capacitor Cf can be connected between the second node N2 and the ground, and the voltage charged in the touch capacitor Ctouch can be changed due to the common capacitor Cf. Accordingly, the voltage of the second node N2 differs, depending on whether or not a touch has occurred. In addition, when the switching transistor ST and the sampling switch SAM are turned on, the voltage of the second node N2 can be transferred to the analog-to-digital converter 130a. A plurality of subpixels 101b, provided as above, can be disposed on the display panel, as illustrated in FIGS. 6 and 10, such that the touchscreen panel 110 can include touch electrodes.

Figure 13:
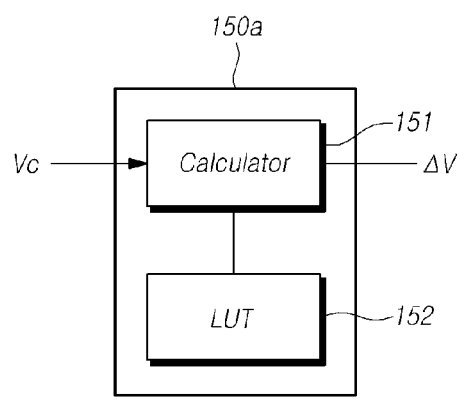
FIG. 13 illustrates a configuration of the controller according to embodiments.

FIG. 13 illustrates a configuration of the controller according to embodiments.

Referring to FIG. 13, the controller 150a can perform operations according to first to third periods. Specifically, in the first period, the controller 150a can transfer the first reference voltage VPRE1 to the second electrode of the touch capacitor Ctouch. In the second period, the controller 150a can transfer the gate signal to the first electrode of the touch capacitor Ctouch. In the third period, the controller 150a can receive a voltage of the second electrode of the touch capacitor Ctouch.

In addition, the controller 150a may include a calculator 151 and a lookup table (LUT) 152. The controller 150a may be a portion of the controller 150 illustrated in FIG. 1. In addition, the controller 150a may be a micro control unit (MCU).

The controller 150a can receive a voltage level of the charging voltage from the analog-to-digital converter 130a. The voltage level of the charging voltage can be transferred as a digital value.

In addition, the lookup table 152 can store values regarding whether or not a touch has occurred according to the voltage level. For example, the lookup table 152 can store reference values regarding voltages charged in the touch electrodes, and can transfer the reference values to the calculator 151. In addition, the calculator 151 can calculate a voltage difference ΔV by comparing a voltage level of the charging voltage Vc, received from the analog-to-digital converter 130a, with a reference value obtained from the lookup table 152. In addition, the lookup table 152 can store information regarding the intensity of the touch corresponding to the voltage difference ΔV. In addition, the calculator 151 can receive touch information, corresponding to the voltage level of the received charging voltage Vc, from the lookup table 152, and output a result value regarding the touch, e.g. a digital signal corresponding to the voltage difference ΔV.

In addition, the controller 150a can calculate the voltage difference ΔV, on the basis of the digital value received from the analog-to-digital converter 130a. Accordingly, a touch sensor circuit for detecting a touch on the touchscreen panel 110 can have a simplified configuration.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A touchscreen display device comprising:
   a plurality of gate lines, through which a gate signal is transferred;
   a plurality of data lines, through which a data signal is transferred;
   a plurality of subpixels electrically connected to the plurality of gate lines and the plurality of data lines;
   a plurality of touch electrodes electrically connected to the plurality of gate lines, and respectively storing a charging voltage in response to the gate signal; and
   a controller configured to detect a touch in response to the charging voltage stored in the plurality of touch electrodes;
   wherein each of the plurality of touch electrodes includes a touch capacitor in which the charging voltage is stored, the touch capacitor having a first electrode electrically connected to a corresponding gate line among the plurality of gate lines and a second electrode electrically connected to a first reference voltage line, through which a first reference voltage is transferred.

2. The touchscreen display device according to claim 1, further comprising a first switching transistor disposed between the second electrode of the touch capacitor and the first reference voltage line.

3. The touchscreen display device according to claim 1, wherein each of the plurality of touch electrodes further includes a conductive layer electrically connected to the second electrode of the touch capacitor.

4. The touchscreen display device according to claim 1, wherein the controller is configured to:
   transfer a touch reference voltage to the second electrode of the touch capacitor in a first period, transfer the gate signal to the first electrode of the touch capacitor in a second period, and receive a voltage of the second electrode of the touch capacitor in a third period.

5. The touchscreen display device according to claim 1, wherein the plurality of subpixels are divided into a plurality of subpixel groups including at least a first subpixel group and a second subpixel group,
   the plurality of touch electrodes include at least a first touch electrode electrically connected to at least one subpixel of the first subpixel group and a second touch electrode electrically connected to at least one subpixel of the second subpixel group,
   the first touch electrode is electrically connected to a first reference voltage line, through which a reference voltage is transferred, and
   the second touch electrode is electrically connected to the first reference voltage line.

6. The touchscreen display device according to claim 1, wherein the plurality of subpixels are divided into a plurality of subpixel groups including at least a first subpixel group and a second subpixel group,
   the plurality of touch electrodes include at least a first touch electrode electrically connected to subpixels of the first subpixel group and a second touch electrode connected to subpixels of the second subpixel group, and
   the first touch electrode and the second touch electrode are electrically connected to different reference voltage lines, through each of which a first reference voltage is transferred.

7. The touchscreen display device according to claim 1, wherein each of the plurality of subpixels includes:
   a first transistor for supplying a driving current in response to the data signal;
   a second transistor for transferring the data signal to the first transistor in response to the gate signal;
   a storage capacitor for maintaining the data signal; and
   an organic light-emitting diode for receiving the driving current from the first transistor.

8. The touchscreen display device according to claim 7, wherein each of the plurality of subpixels further includes a second switching transistor electrically connected to a second reference voltage line to transfer a second reference voltage from the second reference voltage line to the storage capacitor and transfer a voltage charged in the storage capacitor to the second reference voltage line.

9. The touchscreen display device according to claim 1, wherein each of the plurality of subpixels includes:
   a first transistor for transferring a data voltage corresponding to the data signal in response to the gate signal;
   a storage capacitor for maintaining the data voltage;
   a pixel electrode for receiving the data voltage;
   a common electrode corresponding to the pixel electrode; and
   a liquid crystal layer disposed between the pixel electrode and the common electrode.

10. The touchscreen display device according to claim 1, further comprising an analog-to-digital converter configured to receive a voltage of a second electrode of a touch capacitor to convert the voltage into a digital signal, in response to the charging voltage stored in the touch capacitor, wherein the touch capacitor has a first electrode electrically connected to a corresponding gate line among the plurality of gate lines and the second electrode electrically connected to a first reference voltage line, through which a first reference voltage is transferred.

11. A touchscreen display device comprising:
   a substrate including an open area and a non-open area;
   a conductive layer disposed on the substrate, corresponding to the open area;
   a circuit section disposed in the non-open area and configured to generate a driving voltage or a driving current in response to a gate signal and a data signal;
   a gate line, through which the gate signal is transferred to the circuit section;
   a data line, through which the data signal is transferred to the circuit section;
   a light emitter disposed in the open area and electrically connected to the circuit section configured to receive the driving voltage or the driving current;
   a touch capacitor disposed between the gate line and the conductive layer; and a controller configured to detect a touch in response to a voltage charged in the touch capacitor.

12. The touchscreen display device according to claim 11, wherein the circuit section includes:
   a first transistor for generating the driving current;
   a second transistor supplying the data signal to the first transistor by receiving the gate signal;
   a storage capacitor for maintaining a voltage of the data signal; and
   a first switching transistor electrically connected between the touch capacitor and a first reference voltage line,
   wherein the light emitter comprises an organic light-emitting diode to which the driving current is supplied.

13. The touchscreen display device according to claim 12, wherein the circuit section further includes a second switching transistor disposed between a second reference voltage line and the storage capacitor to transfer a second reference voltage from the second reference voltage line to the storage capacitor and transfer a voltage stored in the storage capacitor to the second reference voltage line.

14. The touchscreen display device according to claim 11, wherein the circuit section includes:
   a first transistor for transferring a data voltage corresponding to the data signal in response to the gate signal; and
   a storage capacitor for maintaining the data voltage, and the light emitter includes:
   a pixel electrode for receiving the data voltage;
   a common electrode corresponding to the pixel electrode; and
   a liquid crystal layer disposed between the pixel electrode and the common electrode.

15. The touchscreen display device according to claim 11, wherein the controller configured to:
   transfer a touch reference voltage to a second electrode of the touch capacitor in a first period, transfer the gate signal to a first electrode of the touch capacitor in a second period, and receive a voltage of the second electrode of the touch capacitor in a third period.

16. The touchscreen display device according to claim 11, further comprising an analog-to-digital converter configured to receive a voltage of a second electrode of the touch capacitor to convert the voltage into a digital signal, in response to a charging voltage stored in the touch capacitor.

* * * * *